(12) United States Patent
Lee et al.

(10) Patent No.: US 8,329,324 B2
(45) Date of Patent: *Dec. 11, 2012

(54) VOLTAGE SENSING MEMBER AND BATTERY MODULE EMPLOYED WITH THE SAME

(75) Inventors: BumHyun Lee, Seoul (KR); Jin Kyu Lee, Busan (KR); Hee Soo Yoon, Daejeon (KR); Dal Mo Kang, Daejeon (KR); Jongmoon Yoon, Daejeon (KR); Jae Hun Yang, Daejeon (KR); Inchul Shin, Daejeon (KR); Yongshik Shin, Daejeon (KR)

(73) Assignee: LG Chem, Ltd., Seoul (KR)

( * ) Notice: Subject to any disclaimer, the term of this patent is extended or adjusted under 35 U.S.C. 154(b) by 84 days.

This patent is subject to a terminal disclaimer.

(21) Appl. No.: 12/851,876

(22) Filed: Aug. 6, 2010

(65) Prior Publication Data
US 2011/0059342 A1    Mar. 10, 2011

Related U.S. Application Data

(63) Continuation of application No. PCT/KR2010/001933, filed on Mar. 30, 2010.

(30) Foreign Application Priority Data

Apr. 1, 2009  (KR) .......................... 10-2009-0027931

(51) Int. Cl.
*H01M 10/48* (2006.01)
(52) U.S. Cl. ............ 429/61; 429/90; 429/121; 429/122; 429/162; 429/170; 429/178
(58) Field of Classification Search .................... 429/61, 429/90, 121, 122, 162, 170, 178
See application file for complete search history.

(56) References Cited

U.S. PATENT DOCUMENTS 7,648,538 B2   1/2010 Oogami et al.
(Continued)

FOREIGN PATENT DOCUMENTS

JP   2006-120487 A   5/2006
(Continued)

OTHER PUBLICATIONS

International Search Report for International Application No. PCT/KR2010/001933, mailed Nov. 2, 2010.

*Primary Examiner* — Jane Rhee
(74) *Attorney, Agent, or Firm* — Birch, Stewart, Kolasch & Birch, LLP

(57) ABSTRACT

Disclosed herein is a voltage sensing member for sensing voltages of battery cells constituting a battery module, the voltage sensing member including (a) a pair of supporting parts, i.e., a front supporting part and a rear supporting part, mounted to a bottom of the battery module at regions (a front part and a rear part of the battery module) corresponding to electrode terminal connections of the battery cells, (b) a connection part for electrically interconnecting the front supporting part and the rear supporting part, (c) conductive sensing parts having one-side ends coupled to the corresponding supporting parts via wires, each of the conductive sensing parts having a larger contact surface than each of the wires, and (d) a connector mounted on the front supporting part or the rear supporting part for transmitting the sensed voltages of the battery cells to a battery control device, wherein the conductive sensing parts are connected to the electrode terminal connections of the battery cells in a surface contact manner.

22 Claims, 9 Drawing Sheets

U.S. PATENT DOCUMENTS

| | | |
|---|---|---|
| 7,875,378 B2 * | 1/2011 | Yang et al. .................. 429/61 |
| 2006/0177733 A1 * | 8/2006 | Ha et al. .................. 429/159 |
| 2009/0068513 A1 | 3/2009 | Shirahama |
| 2009/0305116 A1 | 12/2009 | Yang et al. |
| 2009/0311584 A1 | 12/2009 | Yamazaki |

FOREIGN PATENT DOCUMENTS

| | | |
|---|---|---|
| JP | 2008-47510 A | 2/2008 |
| KR | 10-0751623 B1 | 8/2007 |
| KR | 10-2007-0091387 A | 9/2007 |
| KR | 10-2007-0112489 A | 11/2007 |
| KR | 10-2007-0114409 A | 12/2007 |
| KR | 10-2008-0016656 A | 2/2008 |
| WO | WO 2007/102669 A1 | 9/2007 |

* cited by examiner

VOLTAGE SENSING MEMBER AND BATTERY MODULE EMPLOYED WITH THE SAME

CROSS REFERENCE TO RELATED APPLICATIONS

This application is a Continuation of PCT International Application No. PCT/KR2010/001933 filed on Mar. 30, 2010, which claims the benefit of Patent Application No. 10-2009-0027931 filed in Republic of Korea, on Apr. 1, 2009. The entire contents of all of the above applications is hereby incorporated by reference into the present application.

TECHNICAL FIELD

The present invention relates to a voltage sensing member, and, more particularly, to a voltage sensing member for sensing voltages of battery cells constituting a battery module, the voltage sensing member including a pair of supporting parts, i.e., a front supporting part and a rear supporting part, mounted to a bottom of the battery module at regions (a front part and a rear part of the battery module) corresponding to electrode terminal connections of the battery cells, a connection part for electrically interconnecting the front supporting part and the rear supporting part, conductive sensing parts having one-side ends coupled to the corresponding supporting parts via wires, each of the conductive sensing parts having a larger contact surface than each of the wires, and a connector mounted on the front supporting part or the rear supporting part for transmitting the sensed voltages of the battery cells to a battery control device, wherein the conductive sensing parts are connected to the electrode terminal connections of the battery cells in a surface contact manner.

BACKGROUND ART

Recently, a secondary battery, which can be charged and discharged, has been widely used as an energy source for wireless mobile devices. Also, the secondary battery has attracted considerable attention as a power source for electric vehicles (EV) and hybrid electric vehicles (HEV), which have been developed to solve problems, such as air pollution, caused by existing gasoline and diesel vehicles using fossil fuels.

Small-sized mobile devices use one or several battery cells for each device. On the other hand, middle- or large-sized devices, such as vehicles, use a middle- or large-sized battery module having a plurality of battery cells electrically connected to one another because high power and large capacity are necessary for the middle- or large-sized devices.

Preferably, the middle- or large-sized battery module is manufactured so as to have as small a size and weight as possible. For this reason, a prismatic battery or a pouch-shaped battery, which can be stacked with high integration and has a small weight to capacity ratio, is usually used as a battery cell of the middle- or large-sized battery module. Especially, much interest is currently focused on the pouch-shaped battery, which uses an aluminum laminate sheet as a sheathing member, because the weight of the pouch-shaped battery is small, the manufacturing costs of the pouch-shaped battery are low, and it is easy to modify the shape of the pouch-shaped battery.

Also, a battery module is a structural body including a plurality of battery cells which are combined with each other, with the result that the safety and the operating efficiency of the battery module may be lowered when overvoltage, overcurrent, and overheating occur in some of the battery cells. Consequently, a sensing unit for sensing the overvoltage, overcurrent, and overheating is needed. Specifically, a voltage sensor is connected to the battery cells so as to sense and control the operation of the battery cells in real time or at predetermined time intervals.

A secondary battery is being used as a power source for vehicles as a result of the extension of an application range of the secondary battery. For this reason, it is necessary to maintain a stably connected state of the sensing unit even when strong impact or vibration is applied to the secondary battery.

In a conventional battery module, therefore, voltages of the battery cells are sensed in a mechanical coupling manner using bolts and rivets or in a point contact manner using springs.

In the mechanical coupling manner using bolts, bus bars are coupled to electrode leads of the battery cells by bolts at a predetermined torque. In this coupling manner, the bolts may be loosened due to external force such as vibration. Consequently, reflection and management of an optimum torque value are necessary so as to prevent the bolts from being loosened. Also, stress is concentrated on electrode leads, which are relatively weak, and the electrode leads are fatigued, with the result that holes formed in electrode terminal connections such that the bolts are coupled through the holes may easily break.

In the mechanical coupling manner using rivets, on the other hand, electrode leads of the battery cells are connected to each other via the rivets. In this coupling manner, a loosening degree of the rivets due to external force is less than in the mechanical coupling manner using bolts. Even in this coupling manner, however, it is necessary to form holes in electrode terminal connections such that the rivets are inserted through the holes, with the result that breakage similar to the breakage occurring in the mechanical coupling manner using bolts may occur.

That is, the mechanical coupling manner has a problem in that, when external force, such as vibration, is applied to a battery module, a sensing defect occurs due to loosening of the bolts, and, when external force is applied to the battery module, stress is concentrated on holes formed in the electrode terminals of the battery cells such that the bolts or the rivets are inserted through the holes, with the result that breakage of the holes occurs.

In the point contact manner using springs, sensing is performed by direct point contact between the electrode leads of the battery cells and the springs. That is, sensing through the overall surface is not performed but voltage of a corresponding battery cell is sensed using a specific point. In this point contact manner, however, the sensing surface may be separated due to external force, or foreign matter may be introduced between sensing parts, with the result that it may not be possible to perforin stable voltage sensing.

Consequently, there is a high necessity for a voltage sensing member having a specific structure that is capable of performing stable sensing with respect to electrode leads of battery cells and a battery module including the same.

DISCLOSURE

Technical Problem

Therefore, the present invention has been made to solve the above problems, and other technical problems that have yet to be resolved.

Specifically, it is an object of the present invention to provide a voltage sensing member that is capable of stably sensing voltages of battery cells constituting a battery module even when external impact or frequent vibration is applied to the battery module during operation.

It is another object of the present invention to provide a middle- or large-sized battery module manufactured based on a desired power and capacity including the voltage sensing member.

Technical Solution

In accordance with one aspect of the present invention, the above and other objects can be accomplished by the provision of a voltage sensing member for sensing voltages of battery cells constituting a battery module, the voltage sensing member including (a) a pair of supporting parts, i.e., a front supporting part and a rear supporting part, mounted to a bottom of the battery module at regions (a front part and a rear part of the battery module) corresponding to electrode terminal connections of the battery cells, (b) a connection part for electrically interconnecting the front supporting part and the rear supporting part, (c) conductive sensing parts having one-side ends coupled to the corresponding supporting parts via wires, each of the conductive sensing parts having a larger contact surface than each of the wires, and (d) a connector mounted on the front supporting part or the rear supporting part for transmitting the sensed voltages of the battery cells to a battery control device, wherein the conductive sensing parts are connected to the electrode terminal connections of the battery cells in a surface contact manner.

In the voltage sensing member according to the present invention, therefore, the conductive sensing parts are mounted at the front supporting part and the rear supporting part coupled to the lower end of the battery module such that the conductive sensing parts are electrically connected to the electrode terminal connections of the battery cells in a surface contact manner, with the result that it is possible to easily sense voltages of the battery cells more stably and reliably than in a point contact manner using springs.

Also, in the voltage sensing member according to the present invention, it is not necessary to form additional coupling holes in the electrode terminal connections unlike a conventional mechanical coupling manner using bolts or nuts, and therefore, it is possible to prevent breakage of the electrode terminal connections due to external force.

For reference, the surface contact manner described in the specification means a manner in which conductive sensing parts each having a larger contact surface than a wire are electrically connected to the outsides of the electrode terminal connections in a surface contact manner, not in a point or line contact manner.

The conductive sensing parts may be configured in a plate strip shape. Preferably, the conductive sensing parts have a smaller size than electrode terminal connections so as to achieve easy connection of the conductive sensing parts with respect to the electrode terminal connections, and a portion of each of the electrode terminal connections is cut to a size corresponding to the size of each of the conductive sensing parts.

Specifically, the electrode terminal connections mean series-connection regions between cathode terminals of battery cells and anode terminals of neighboring battery cells. Portions of the cathode terminals or the anode terminals constituting the electrode terminal connections are cut, conductive sensing parts are located at the cut portions of the cathode terminals or the anode terminals, and the conductive sensing parts are connected to uncut portions of the electrode terminals in a surface contact manner, thereby achieving easier connection between the conductive sensing parts and the electrode terminal connections.

Width and height of each of the conductive sensing parts may be selected within an appropriate range in which stable electrical connection between the cathode terminals and the anode terminals, which is an original function of the electrode terminal connections, is achieved, and, in addition, the conductive sensing parts are connected to the electrode terminal connections in a surface contact manner so as to stably sense voltages of the battery cells.

In an example of the appropriate range, each of the conductive sensing parts may have a width equivalent to 10 to 80% of the width of each of the electrode terminal connections so as to achieve surface contact. If the width of each of the conductive sensing parts is less than 10% of the width of each of the electrode terminal connections, it is difficult to stably sense voltages of the electrode terminals in a surface contact manner. On the other hand, if the width of each of the conductive sensing parts is greater than 80% of the width of each of the electrode terminal connections, the size of each of the electrode terminal connections is excessively reduced, with the result that internal contact resistance between the cathode terminals and the anode terminals is increased, which is not preferable.

In another example, each of the conductive sensing parts may have a height equivalent to 20 to 70% of the height of each of the electrode terminal connections. If the height of each of the conductive sensing parts is less than 20 70% of the height of each of the electrode terminal connections, it is difficult to stably sense voltages of the electrode terminals in a surface contact manner. On the other hand, if the height of each of the conductive sensing parts is greater than 70% of the height of each of the electrode terminal connections, the size of each of the electrode terminal connections is excessively reduced, with the result that internal contact resistance between the cathode terminals and the anode terminals is increased, which is not preferable.

Each of the conductive sensing parts may have a surface contact area with respect to a corresponding one of the electrode terminal connections equivalent to 30 to 60% of a connection area (an area of an interface between a cathode terminals and a corresponding anode terminal) of each of the electrode terminal connections so as to achieve stable electrical connection between the cathode terminals and the anode terminals, which is an original function of the electrode terminal connections, as described above, and, at the same time, to stably sense voltages of the battery cells in a surface contact manner.

Preferably, at each of the electrode terminal connections, one-side electrode terminal (a) is cut to a size corresponding to a size of each of the conductive sensing parts, and one-side electrode terminal (a) and a corresponding one of the conductive sensing parts are connected to the other-side electrode terminal (b) in a surface contact manner.

For example, in a case in which one-side electrode terminal (a) is a cathode terminal, a portion of the cathode terminal may be cut to a size corresponding to a size of each of the conductive sensing parts, and the remaining portion of the cathode terminal and a corresponding one of the conductive sensing parts may be connected to the other-side electrode terminal (b), i.e., an anode terminal with a predetermined contact surface.

Connection between the conductive sensing parts and the electrode terminal connections is not particularly restricted as long as the connection between the conductive sensing parts and the electrode terminal connections is easily achieved. For example, the connection between the conductive sensing parts and the electrode terminal connections may be achieved by welding. Since the conductive sensing parts and the electrode terminal connections are securely coupled to each other by welding, it is possible to reliably and stably sense the battery cells even when external force is applied to the battery cells.

In addition, when coupling using welding is performed in the structure in which one-side electrode terminal (a) is cut to a size corresponding to a size of each of the conductive sensing parts, and one-side electrode terminal (a) and a corresponding one of the conductive sensing parts is connected to the other-side electrode terminal (b) in a surface contact manner as in the preferred example as previously described, it is possible to perform welding in a two-layered structure of the electrode terminal (a)—a corresponding one of the conductive sensing parts/the electrode terminal (b), not in a three-layered structure of the electrode terminal (a)/the electrode terminal (b)/a corresponding one of the conductive sensing parts. Consequently, it is possible to prevent the decrease of coupling force due to welding of the multi-layered structure.

The front supporting part and the rear supporting part are plate-shaped members disposed at regions of the battery module corresponding to the electrode terminal connections of the battery cells, i.e., the bottoms of the front and rear parts of the battery module. The front supporting part and the rear supporting part serve to mechanically couple the conductive sensing parts and, at the same time, to electrically connect the conductive sensing parts to a battery control device, such as a battery management system (BMS). Preferably, therefore, the front supporting part and the rear supporting part are formed of a printed circuit board (PCB).

It is necessary for the conductive sensing parts to exhibit a predetermined mechanical strength, and it is necessary to achieve connection between the conductive sensing parts and the electrode terminals. For these reasons, the conductive sensing parts may be formed of a metal strip. For example, the conductive sensing parts may be formed of a copper strip exhibiting high conductivity.

The electrode terminal connections may be bent perpendicularly in a direction in which ends of anode terminals of the battery cells facing cathode terminals of the battery cells face each other so as to easily achieve surface contact between the electrode terminal connections and the conductive sensing parts.

In the above structure, the anode terminals may be copper electrode leads, and the cathode terminals may be aluminum electrode leads.

In this case, at the each of the electrode terminal connections, an end of each of the copper electrode leads may be cut to a size corresponding to a size of each of the conductive sensing parts, and each of the copper electrode leads and a corresponding one of the conductive sensing parts may be coupled to each of the aluminum electrode leads by welding.

Specifically, the copper electrode leads, which are anode terminals of the battery cells, and the conductive sensing parts, which are copper strips, are connected to the aluminum electrode leads, which are cathode terminals of the battery cells, by welding in a two-layered structure.

An insulative protection film may be provided at a connection region between each of the conductive sensing parts and a corresponding one of the electrode terminal connections.

That is, the insulative protection film may be applied to or coated on the upper end of the connection region so as to secure corrosion resistance at the connection region and to prevent a sensing defect due to corrosion.

In accordance with another aspect of the present invention, there is provided a battery module including the voltage sensing member with the above-stated construction.

In a preferred example, the battery module may include (a) a battery cell stack including a plurality of battery cells or unit modules connected in series to each other in a state in which the battery cells or the unit modules stand in a lateral direction thereof, (b) an upper case configured in a structure to surround one side of the battery cell stack and to surround a portion of an upper end and a portion of a lower end of the battery cell stack, the upper case being provided at a front part thereof with external input and output terminals, (c) a lower case coupled to the upper case for surrounding the other side of the battery cell stack and surrounding a portion of the upper end and a portion of the lower end of the battery cell stack, the lower case being provided at a front part thereof with bus bars for connecting electrode terminals of the battery cells to the external input and output terminals, the voltage sensing member being mounted at a bottom of the lower case, and (d) a front cover mounted to the front part of the lower case for protecting connection regions between the electrode terminals of the battery cells and the bus bars from outside, the front cover being made of an insulative material.

In a battery module including a plurality of battery cells, it is necessary to measure and control voltages and temperatures of the battery cells in consideration of the safety and operational efficiency of the battery module. Especially, it is necessary to measure voltages of the respective battery cells or the respective electrical connection regions between the battery cells. For this reason, the attachment of a sensing member for measuring voltages of the battery cells is one of the principal factors further complicating the construction of the battery module.

The above-mentioned problem may be solved by the provision of a sensing member mounted along one of the cases, i.e., the upper case or the lower case, for sensing voltages of the battery cells in accordance with the present invention. That is, as described above, the sensing member may include sensing parts mounted in spaces defined on the front and rear parts of the lower case and a connection part for interconnecting the sensing parts. As described above, the sensing member may be a voltage sensing member. According to circumstances, a temperature sensing member may be further included.

In a preferred example, the voltage sensing member may be configured in a structure in which conductive sensing parts are mounted in spaces defined on the front and rear parts of the lower case such that the conductive sensing parts are coupled to electrode terminal connections, and a front supporting part, a rear supporting part and a connection part are mounted to the bottom of the lower case, whereby the electrical surface contact therebetween is stably maintained when external impact is applied to the battery module.

The lower case may be provided at the bottom thereof with a depression into which the connection part is inserted, whereby the battery module is configured in a more compact structure. Specifically, the depression may be provided at the inside thereof with a plurality of protrusions which are alternately oriented to stably fix the connection part inserted in the depression.

As described above, the battery cell stack is mounted in the cases in such a manner that a plurality of battery cells or unit modules stand in the lateral direction thereof. In the specification, regions of the battery cells or the unit modules where the electrode terminals of the battery cells or the unit modules protrude are defined as front and rear directions, and the opposite side edges of the battery cells or the unit modules are defined as a lateral direction. Consequently, the battery cell stack is configured in a structure in which the battery cells or the unit modules are erected such that one of the side edges of the battery cells or the unit modules stands with respect to the ground while the electrode terminals of the battery cells or the unit modules are oriented in the front and rear directions of the battery module.

Preferably, the battery cell stack includes a plurality of unit modules each including plate-shaped battery cells having electrode terminals formed at the upper and lower ends thereof, and each unit module includes two or more battery cells configured in a stacked structure in which electrode terminals of the battery cells are connected in series to each other and electrode terminal connections are bent such that the battery cells are stacked and a pair of high-strength cell covers configured to surround outsides of the battery cells excluding the electrode terminals of the battery cells when the cell covers are coupled with each other.

The battery cells are connected in series and/or parallel with each other in each of the unit modules. In a preferred example as described above, a plurality of unit modules may be manufactured by coupling electrode terminals of the battery cells to each other, while arranging the battery cells in series in the longitudinal direction, such that the electrode terminals of the battery cells are successively adjacent to each other, bending the battery cells by twos or more such that the battery cells are stacked while being in tight contact with each other, and surrounding predetermined numbers of the stacked battery cells with the cell covers. The sequence of the manufacturing processes may be partially changed. For example, a plurality of unit modules may be manufactured, and then electrical connection between the unit modules may be performed.

The battery cell stack, in which the battery cells are stacked in high integration while the electrode terminals of the battery cells are connected with each other, may be vertically mounted in the separable upper and lower cases that are coupled with each other in the assembly-type coupling structure.

Preferably, the upper case and the lower case are configured in a structure in which the upper case and the lower case surround only the outer circumference of the battery cell stack, and therefore, most of the outside of the battery cell stack is exposed to the outside, so as to achieve easy dissipation of heat from the battery cell stack in a state in which the upper case and the lower case are coupled to each other. Consequently, as described above, the upper case is configured in a structure to surround one side of the battery cell stack and to surround a portion of an upper end and a portion of a lower end of the battery cell stack, and the lower case is configured in a structure to surround the other side of the battery cell stack and to surround a portion of the upper end and a portion of the lower end of the battery cell stack.

Preferably, the lower case is provided at the front part and a rear part thereof with spaces in which supporting parts and conductive sensing parts of the voltage sensing member are placed, and the conductive sensing parts are connected to portions of series-connection bent regions (electrode terminal connections) of the electrode terminals of the battery cells in a surface contact manner by welding.

For example, surface contact between the conductive sensing parts and the electrode terminal connections may be achieved as follows. As described above, a plurality of unit modules may be manufactured by coupling electrode terminals of the battery cells to each other, while arranging the battery cells in series in the longitudinal direction, such that the electrode terminals of the battery cells are successively adjacent to each other, bending the battery cells by twos or more such that the battery cells are stacked while being in tight contact with each other, and surrounding predetermined numbers of the stacked battery cells with the cell covers, and then portions of the conductive sensing parts and the electrode terminal connections may be welded in a state in which the unit modules are mounted to the lower case.

According to circumstances, a plurality of unit modules may be manufactured by stacking two or more battery cells such that electrode terminals of the battery cells are adjacent to each other in a state in which the electrode terminals are not coupled to each other and surrounding predetermined numbers of the stacked battery cells with the cell covers, and then welding of the electrode terminal connections of the battery cells and welding of the conductive sensing parts and the electrode terminal connections may be simultaneously performed in a state in which the unit modules are mounted to the lower case. In this case, the number of processes for manufacturing the battery module is decreased, thereby reducing manufacturing costs.

Meanwhile, the upper case and the lower case may be provided in the insides thereof with pluralities of mounting grooves in which the outer circumferences of the battery cells or the unit modules are inserted.

When the battery cell stack includes a plurality of unit modules, the cell covers of the respective unit modules are provided at the outer surfaces adjacent to the upper and lower ends thereof with steps of a predetermined size for easily fixing the respective unit modules, and the cell covers are provided at the outer surfaces adjacent to the opposite sides thereof with steps of a predetermined size for easily fixing the unit modules, such that the battery cell stack is stably mounted to the cases and the unit modules are stacked while being in tighter contact with each other, whereby the overall size of the battery cell stack is reduced. The mounting grooves of the upper and lower cases may be configured in a structure corresponding to the steps.

Consequently, the steps formed adjacent to the outer circumferences of the unit modules are inserted in the mounting grooves of the upper and lower cases, whereby a very stable coupling structure is provided even though only the outer circumferences of the unit modules are fixed to the cases.

Preferably, the lower case is provided at the front part thereof with a pair of slits through which the outermost electrode terminals of the battery cell stack are inserted. When the battery cell stack is mounted to the lower case, the outermost electrode terminals of the battery cell stack are exposed through the slits and then bent such that the outermost electrode terminals of the battery cell stack are brought into tight contact with the front part of the lower case. Consequently, the outermost electrode terminals of the battery cell stack are more easily connected to the bus bars located at the front part of the lower case.

According to circumstances, a conductive member may be further mounted to at least one of the external input and output terminals for fixing the upper end of the front cover and assisting with the connection of a power cable necessary for electrical connection. The conductive member may include bent parts for elastically surrounding the power cable while being coupled to the external input and output terminals. Also, the front cover may be further provided with holes for fixing a power cable. Insulative coupling members coupled to corresponding portions of the power cable may be inserted into the holes to fix the power cable.

The front cover may be coupled to the lower case, for example, in an assembly coupling fashion.

The upper and lower cases are coupled to each other in such a manner that the unit cell stack is mounted to one case (for example, the lower case), which is then coupled to the other case (for example, the upper case) in an assembly manner. The cases may be coupled to each other in various manners. For example, the cases may be coupled to each other in a structure in which screws are threadedly engaged into threaded grooves formed at opposite sides of the cases or in a structure in which hooks are formed at one of the cases and coupling holes corresponding the hooks are formed at the other case such that the cases can be coupled to each other without using an additional member.

Preferably, the lower case is provided at the lower end of the front and/or the rear thereof with a coupling part protruding from the lower case such that the coupling part is fixed to an external device, the coupling part having a through hole formed in a center thereof.

According to circumstances, a battery control device, such as a battery management system (BMS), connected to the voltage sensing member for monitoring and controlling the operation of the battery module may be mounted to the rear of the lower case.

In this structure, the sensing parts of the voltage sensing member are mounted in the front and rear parts of the lower case, the sensing parts mounted in the rear part of the lower case are connected to the BMS mounted to the rear end of the rear part of the lower case, and the sensing parts mounted at the front part of the lower case are connected to the battery control device via the connection part mounted to the bottom of the lower case.

In a preferred example, the sensing member may include thermistors, as temperature sensing parts, mounted to the battery cells or the unit modules of the battery cell stack. The thermistors may be connected to the battery control device.

A battery control device may be mounted to each battery module, or a battery control device may be mounted to a plurality of battery modules. In the former case, the lower case may be integrally provided at the rear part thereof with a protruding battery control device receiving part in which the battery control device is integrally assembled, preferably the battery control device is received. The battery control device receiving part may be provided with a thermistor connector and a communication connector.

Electrically insulative covers are further disposed on the outer surfaces of the supporting parts mounted to the bottom of the lower case, thereby increasing isolation of the supporting parts from the outside and improving a mechanical coupling degree between the supporting parts and the lower case.

The middle- or large-sized battery module according to the present invention is generally configured in a compact structure, and the mechanical coupling and electrical connection of the middle- or large-sized battery module are stably accomplished without using a plurality of members. Also, it is possible to configure a battery module using a predetermined number of battery cells, for example, four, six, eight, or ten battery cells, thereby effectively installing a necessary number of battery modules in a limited space.

In accordance with a further aspect of the present invention, therefore, there is provided a middle- or large-sized battery system having high power and large capacity, the battery system being configured by connecting a plurality of battery modules.

The middle- or large-sized battery system according to the present invention may be manufactured by combining unit modules based on desired power and capacity. The battery system according to the present invention is preferably used as a power source for electric vehicles, hybrid electric vehicles, or plug-in hybrid electric vehicles, which have a limited installation space and are exposed to frequent vibration and strong impact in consideration of the installation efficiency and structural stability of the battery system as previously described.

Advantageous Effects

As is apparent from the above description, the voltage sensing member according to the present invention is configured in a structure in which conductive sensing parts are connected to electrode terminal connections of battery cells in a surface contact manner, and therefore, it is possible to stably sense voltages of battery cells even when strong external impact or vibration is applied to the battery cells. Also, it is possible to easily manufacture a middle- or large-sized battery system having desired power and capacity using a battery module including the voltage sensing member according to the present invention as a unit body.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, exemplary embodiments of the present invention will be described in detail with reference to the accompanying drawings. It should be noted, however, that the scope of the present invention is not limited by the illustrated embodiments.

Figure 1:
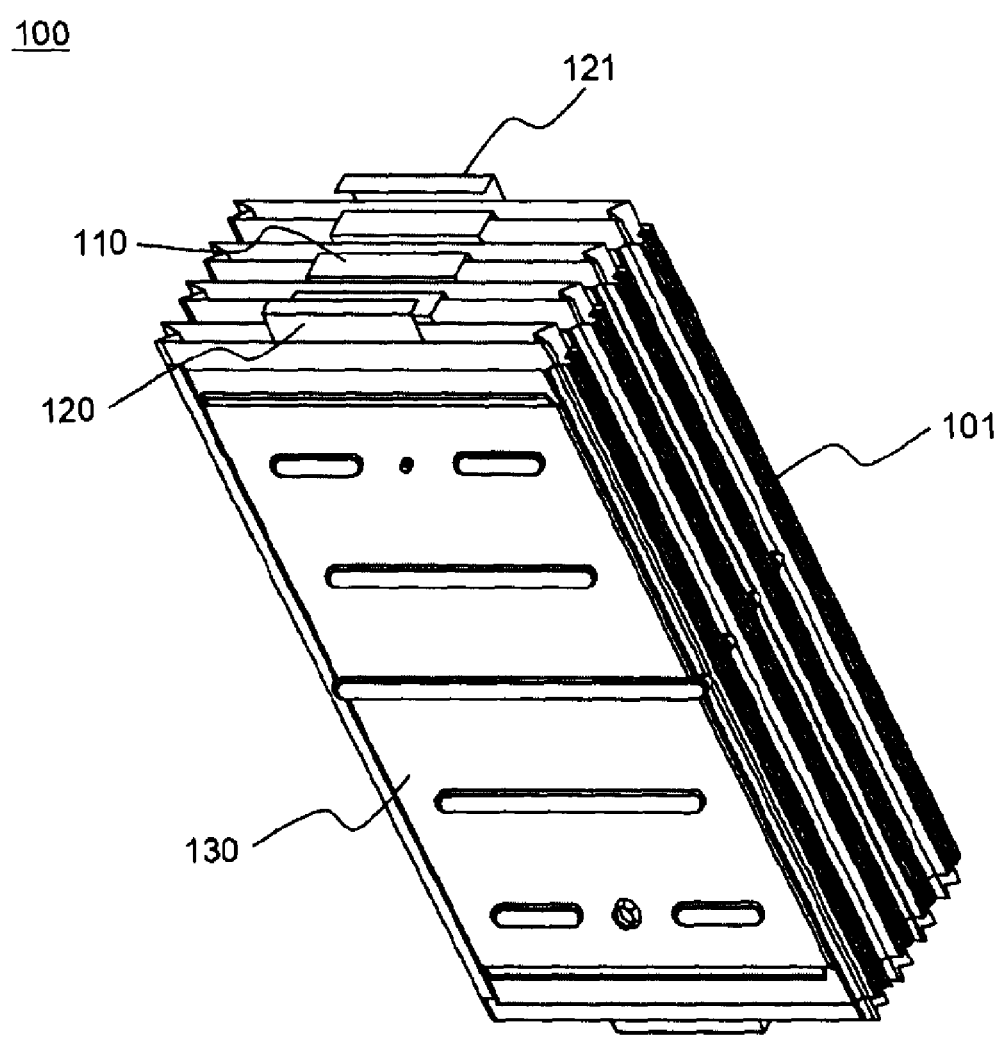
FIG. 1 is a perspective view illustrating a battery cell stack constituted by a plurality of unit modules.

FIG. 1 is a perspective view illustrating a battery cell stack constituted by a plurality of unit modules.

Referring to FIG. 1, a battery cell stack 100 includes four unit modules 101 and 130. Each of the unit modules 130 has two battery cells (not shown) mounted therein. Therefore, the battery cell stack 100 includes a total of eight battery cells. Electrode terminals between the respective battery cells are connected in series to each other, and electrode terminals between the respective unit modules are also connected in series to each other. Electrode terminal connections 110 are bent in a '[' shape in section to configure the battery cell stack. Outside electrode terminals 120 and 121 of the outermost unit modules 130 and 101 are bent inward in a '⌐' shape in section in a state in which the outside electrode terminals 120 and 121 protrude slightly more than the other electrode terminal connections 110.

Figure 2:
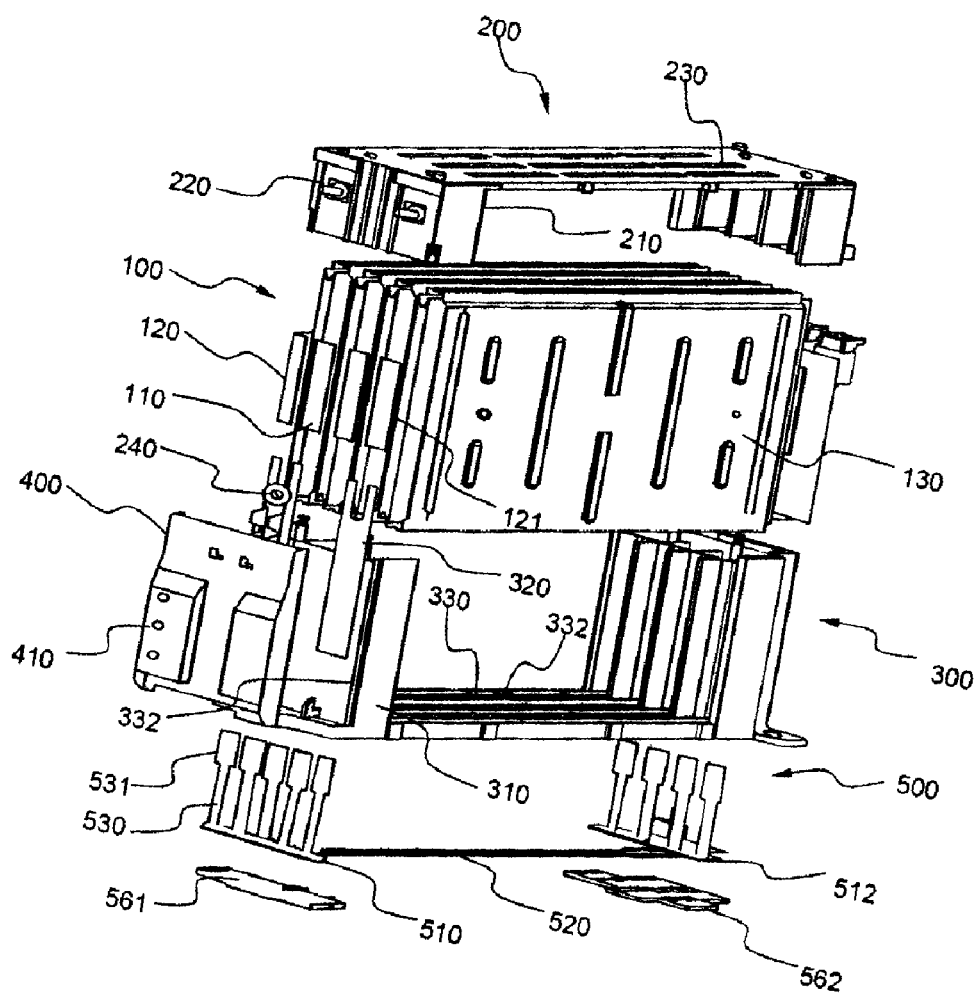
FIG. 2 is an exploded view illustrating upper and lower cases for surrounding the battery cell stack and a voltage sensing member.

FIG. 2 is an exploded view illustrating upper and lower cases for surrounding the battery cell stack of FIG. 1 and a voltage sensing member.

Referring to FIG. 2, an upper case 200 is configured to surround one side of the battery cell stack 100 and to surround a portion of the upper end and a portion of the lower end of the battery cell stack 100. The upper case 200 is provided at the front part 210 thereof with a pair of external input and output terminals 220.

The battery cell stack 100 is mounted in a lower case 300 in a state in which the unit modules 130 stand in the lateral direction thereof. The lower case 300 is coupled to the upper case 200 for surrounding the other side of the battery cell stack 100 and surrounding a portion of the upper end and a portion of the lower end of the battery cell stack 100. The lower case 300 is provided at the front part 310 thereof with a pair of bus bars 320 for connecting electrode terminals of the battery cell stack 100 to the external input and output terminals 220. That is, the upper case 200 and the lower case 300 are configured in a structure in which the upper case 200 and the lower case 300 surround only the outer circumference of the battery cell stack 100, and therefore, most of the outside of the battery cell stack 100 is exposed to the outside, so as to achieve easy dissipation of heat from the battery cell stack 100 in a state in which the upper case 200 and the lower case 300 are coupled to each other.

The bus bars 320 are configured such that upper ends of the bus bars 320 are formed in the shape of a depressed groove, into which the external input and output terminals 220, provided at the front part 210 of the upper case 200, are inserted when the upper case 200 and the lower case 300 are coupled to each other.

At the insides of the upper case 200 and the lower case 300 are formed a plurality of mounting grooves 330 into which the outer circumferences of battery cells or unit modules are inserted. The mounting grooves 330 are configured in a corresponding structure to which outer circumferential steps of the unit modules 130 are coupled.

Also, a plurality of through holes 230 and 332, through which a coolant (mainly, air) flows, are formed in the upper case 200 and the lower case 300 for achieving effective cooling in a state in which the battery cell stack 100 is mounted.

A front cover 400, which is made of an insulative material, is mounted to the front part 310 of the lower case 300 for protecting connection regions between the electrode terminals of the battery cells and the bus bars from the outside.

At one of the external input and output terminals 220 is further provided a conductive member 240 for fixing the upper end of the front cover 400 and assisting a power cable (not shown) for electrical connection to be mounted. For easy understanding, the conductive member 240 is shown as being separated from one of the external input and output terminals 220 and being located in front of a corresponding one of the bus bars 320 in the drawing. The conductive member 240 is provided at one side thereof with a coupling insertion hole, into which a corresponding one of the external input and output terminals 220 is coupled. Also, the conductive member 240 includes a pair of bent portions for elastically surrounding the power cable.

At the front cover 400 are formed holes 410 for fixing the power cable. Insulative coupling members (not shown) coupled to corresponding portions of the power cable are inserted into the holes 410 to fix the power cable.

At left and right sides of the front part 310 of the lower case 300 are formed a pair of slits 322 through which outermost electrode terminals 120 and 121 of the battery cell stack 100 are inserted. When the battery cell stack 100 is mounted to the lower case 300, the outermost electrode terminals 120 and 121 of the battery cell stack 100 are exposed through the slits 322, and then the outermost electrode terminals 120 and 121 of the battery cell stack 100 are bent such that the outermost electrode terminals 120 and 121 of the battery cell stack 100 come into contact with the front part 310 of the lower case 300. As a result, the outermost electrode terminals 120 and 121 of the battery cell stack 100 are more easily brought into contact with the bus bars 320 provided at the front part 310 of the lower case 300.

A voltage sensing member 500, which is mounted at the bottoms of the front and rear parts of the lower case 300, includes a pair of supporting parts 510 and 512 mounted to the bottom of the lower case 300 at regions corresponding to the electrode terminal connections 110 of the battery cells or the unit modules, a wire-shaped connection part 520 for electrically interconnecting the supporting parts 510 and 512, plate strip type conductive sensing parts 531 having one-side ends coupled to the corresponding supporting parts 510 and 512 via wires 530, and insulative covers 561 and 562 mounted to the bottom of the voltage sensing member 500.

The conductive sensing parts 531 are electrically connected to the lower ends of the electrode terminals of the battery cells and/or series-connection bent regions of the electrode terminals of the battery cells, i.e., the tops of the electrode terminal connections 110, by welding. The structure of the voltage sensing member 500 will be described in more detail with reference to FIGS. 5 to 7.

Figure 3:
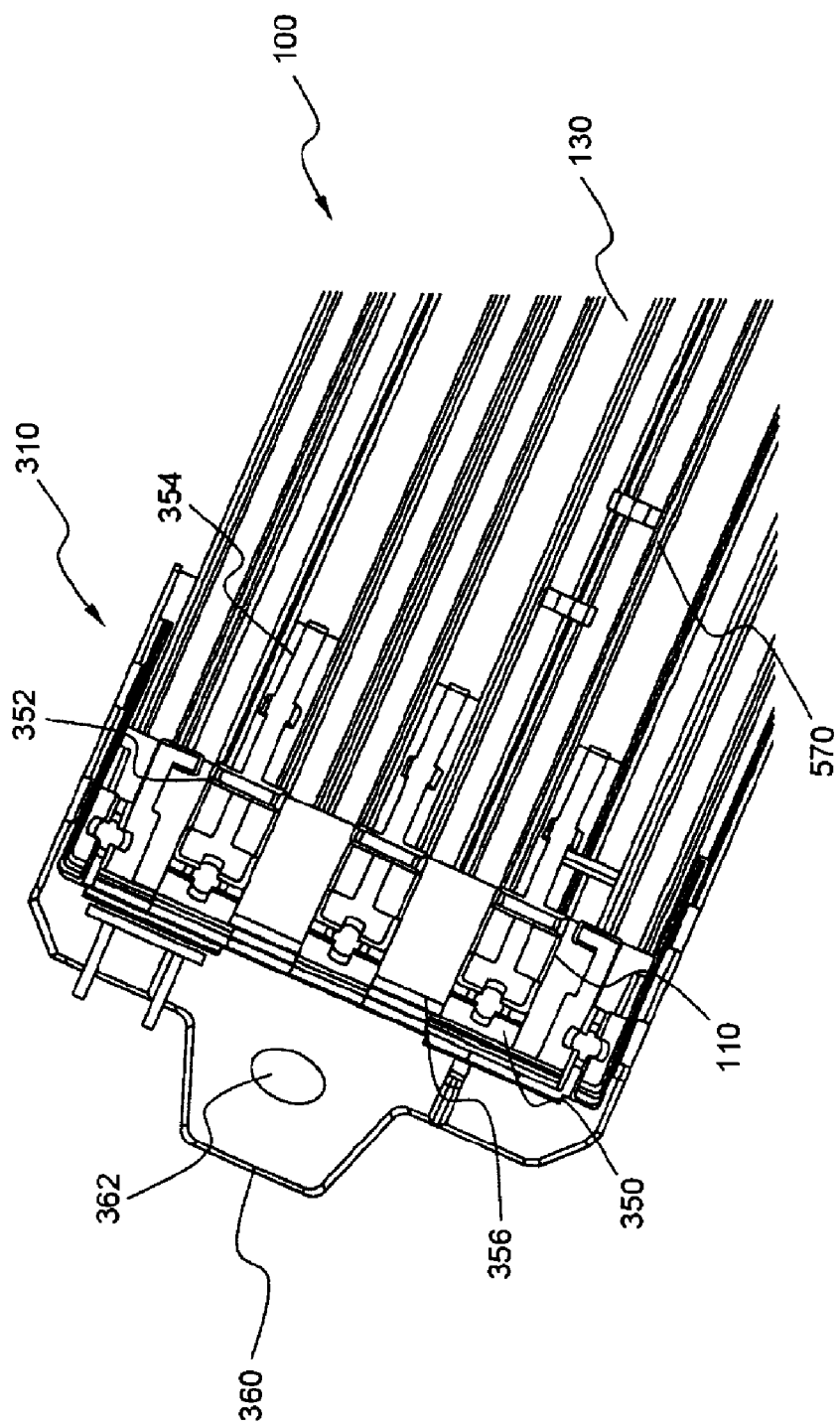
FIGS. 3 and 4 are partially enlarged plan views illustrating the upper end and the lower end of the lower case, respectively.
Figure 4:
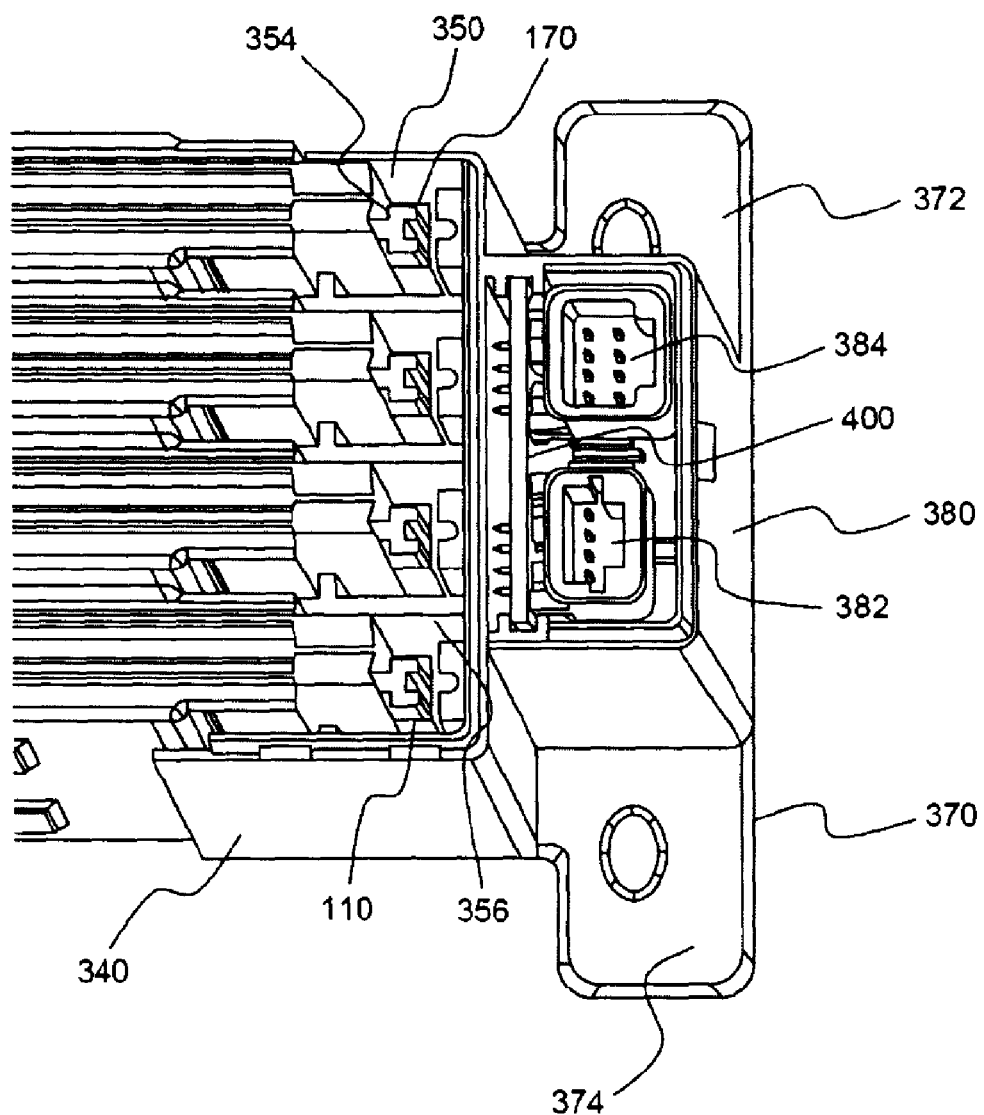

FIGS. 3 and 4 are partially enlarged plan views respectively illustrating upper and lower ends of a lower case of a middle- or large-sized battery module according to an embodiment of the present invention in a state in which unit modules are mounted in the lower case.

Referring to these drawings together with FIG. 2, the lower case 300 is provided at the insides of the front part 310 and the rear part 340 thereof with pluralities of fixing grooves 350 in which the electrode terminal connections 110 of the unit modules 130 and electrode terminal connections 170 of the battery cells mounted in the respective unit modules 130 are inserted. The fixing grooves 350 are formed approximately in a shape corresponding to the electrode terminal connections 110 and 170. Consequently, the fixing grooves 350 prevent the battery cell stack 100 from moving forward and rearward and maintain stable insulation between the neighboring electrode terminal connections. Specifically, a cell cover movement preventing protrusion 352, a cell cover fixing guide 354, and an electrode terminal isolation wall 356 are formed in each of the fixing grooves 350 for achieving more stable fixing and insulation of the unit modules 130.

Also, the lower case 300 is provided at the lower end of the front part thereof with a coupling part 360 which protrudes from the lower case 300 and has a through-hole 362 in the center thereof such that the lower case 300 is fixed to an external device (not shown).

A pair of protruding coupling parts 370 is formed at the lower end of the rear part of the lower case 300. One of the protruding coupling parts 370, i.e., a coupling parts 372, is formed such that the coupling part 372 is higher by a height equivalent to the thickness of the other protruding coupling part, i.e., a coupling parts 374, than the coupling part 374. Consequently, when a middle- or large-sized battery system is manufactured using a plurality of battery modules, the coupling between the battery modules is easily achieved, and the battery system is manufactured in a compact structure. Of course, however, the coupling parts 370 may be configured in various other structures different from the above structure.

At the rear end of the rear part 340 of the lower case 300 is mounted a battery management system (BMS) 400. The BMS 400 is received in a BMS receiving part 380 integrally formed at the lower case 300. A thermistor connector 382 and a communication connector 384 are mounted at the BMS receiving part 380.

Figure 5:
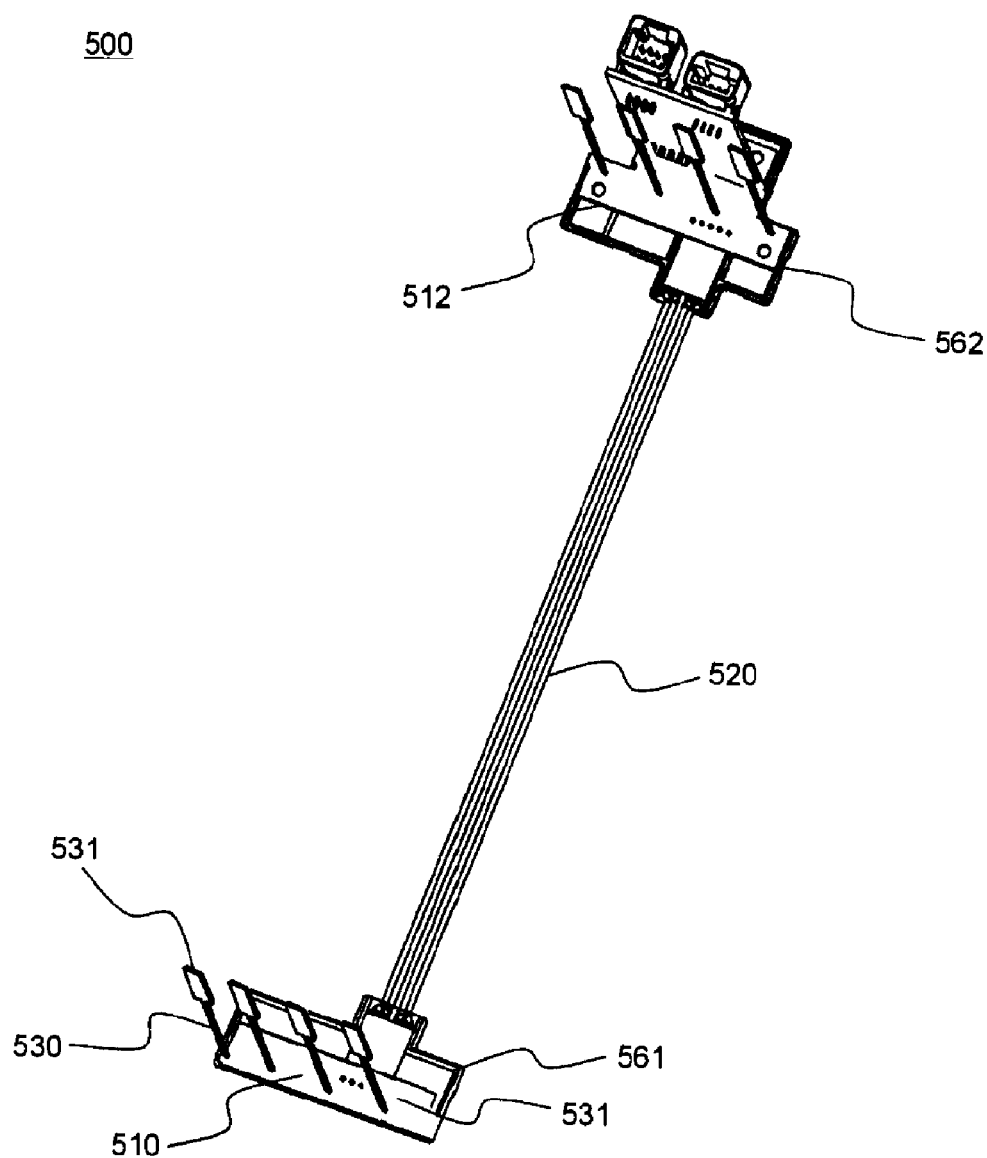
FIG. 5 is a perspective view illustrating a voltage sensing member according to an embodiment of the present invention.
Figure 6:
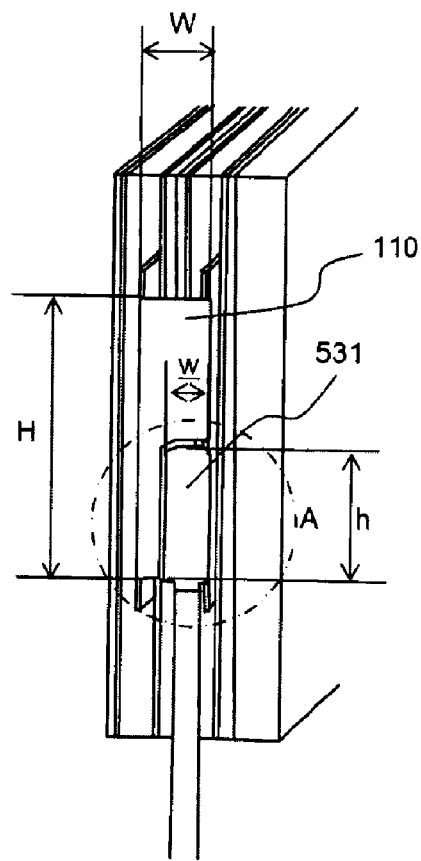
FIG. 6 is a partial typical view illustrating a state in which the voltage sensing member according to the embodiment of the present invention is coupled to battery cells.
Figure 7:
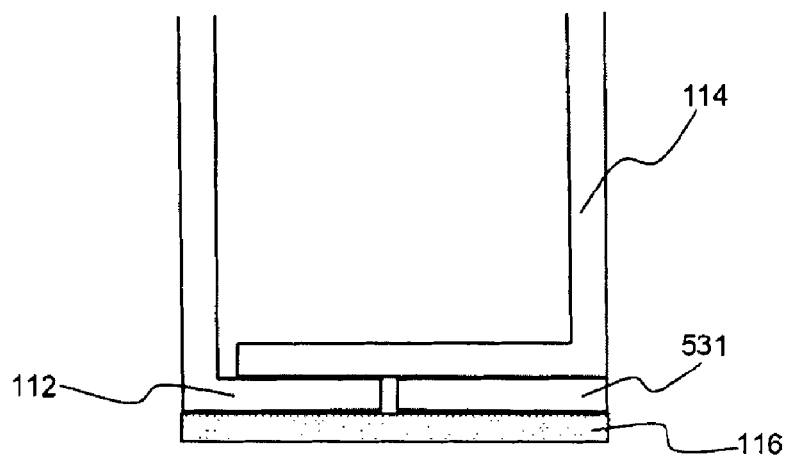
FIG. 7 is a typical view illustrating the bottom of a region A of FIG. 6.

FIG. 5 is a perspective view typically illustrating a voltage sensing member according to an embodiment of the present invention, FIG. 6 is a partial typical view illustrating a state in which the voltage sensing member according to the embodiment of the present invention is coupled to battery cells, and FIG. 7 is a typical view illustrating the bottom of a region A of FIG. 6.

Referring to these drawings together with FIG. 1, the voltage sensing member 500 includes a front supporting part 510 and a rear supporting part 512 mounted to the bottom of the battery module 600 at regions corresponding to the electrode terminal connections 110 of the battery cells or the unit modules, a wire-shaped connection part 520 for electrically interconnecting the front supporting part 510 and a rear supporting part 512, pluralities of plate strip type conductive sensing parts 531 having one-side ends coupled to the corresponding supporting parts 510 and 512 via wires 530, each of the conductive sensing parts 531 having a larger contact surface than each of the wires 530, and electrically insulative covers 561 and 562 mounted to the bottoms of the BMS 400 mounted on the rear supporting part 512, the connector 384, and the voltage sensing member 500.

Referring to FIGS. 6 and 7, at the electrode terminal connections 110, a copper electrode lead 112 of each of the battery cells is cut to a size corresponding to the size of the conductive sensing parts 531, and the conductive sensing parts 531, formed of a copper strip, are coupled to an aluminum electrode lead 114 of each of the battery cells by welding.

Also, each of the conductive sensing parts 531 has a width w equivalent to approximately 60% of the width W of each of the electrode terminal connections 110, and each of the conductive sensing parts 531 has a height h equivalent to approximately 50% of the height H of each of the electrode terminal connections 110. As a result, each of the conductive sensing parts 531 has a surface contact area equivalent to approximately 43% of the contact area of each of the electrode terminal connections 110.

Consequently, the width w and the height h of the conductive sensing parts 531 enable the conductive sensing parts 531 to be stably connected to the electrode terminal connections 110 of the battery cells. Even when external impact is applied to the battery module, electrical connection between the conductive sensing parts 531 and the electrode terminal connections 110 of the battery cells is stably maintained. Also, it is possible to sense voltages at the respective electrode terminals of the battery cells and/or the unit modules.

The conductive sensing parts 531, which are formed of a copper strip, are connected to the aluminum electrode leads 114 together with the copper electrode leads 112 by welding, thereby achieving a two-layered welding structure, which exhibits higher weldability than a three-layered welding structure in which the copper electrode leads 112 and the conductive sensing parts 531 are sequentially stacked on the aluminum electrode leads 114.

As needed, an insulative protection film 116 may be attached to the top of a connection region between each of the conductive sensing parts 531 and a corresponding one of the copper electrode leads 112 for preventing the connection region, which is formed by welding, from being corroded by foreign matter.

Figure 8:
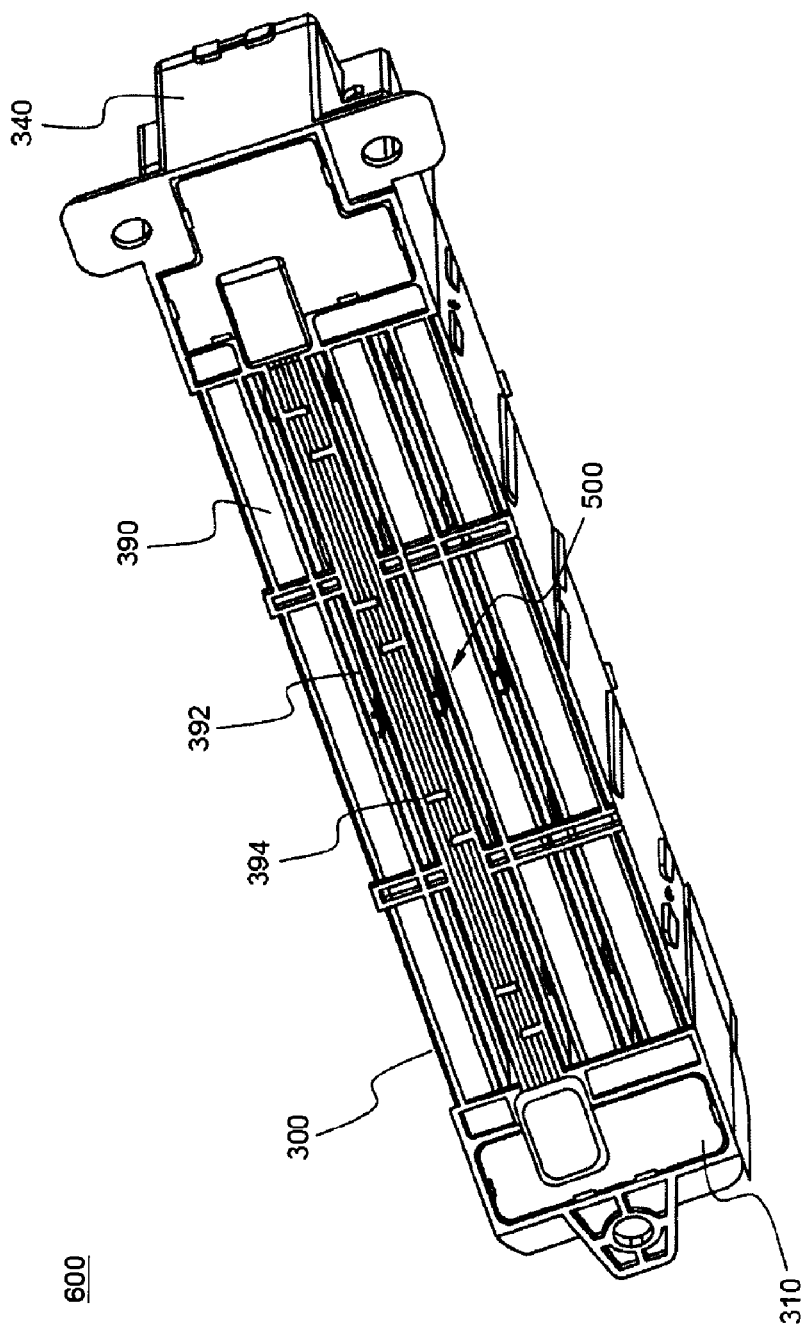
FIGS. 8 to 10 are perspective views illustrating a middle- or large-sized battery pack according to an embodiment of the present invention.
Figure 9:
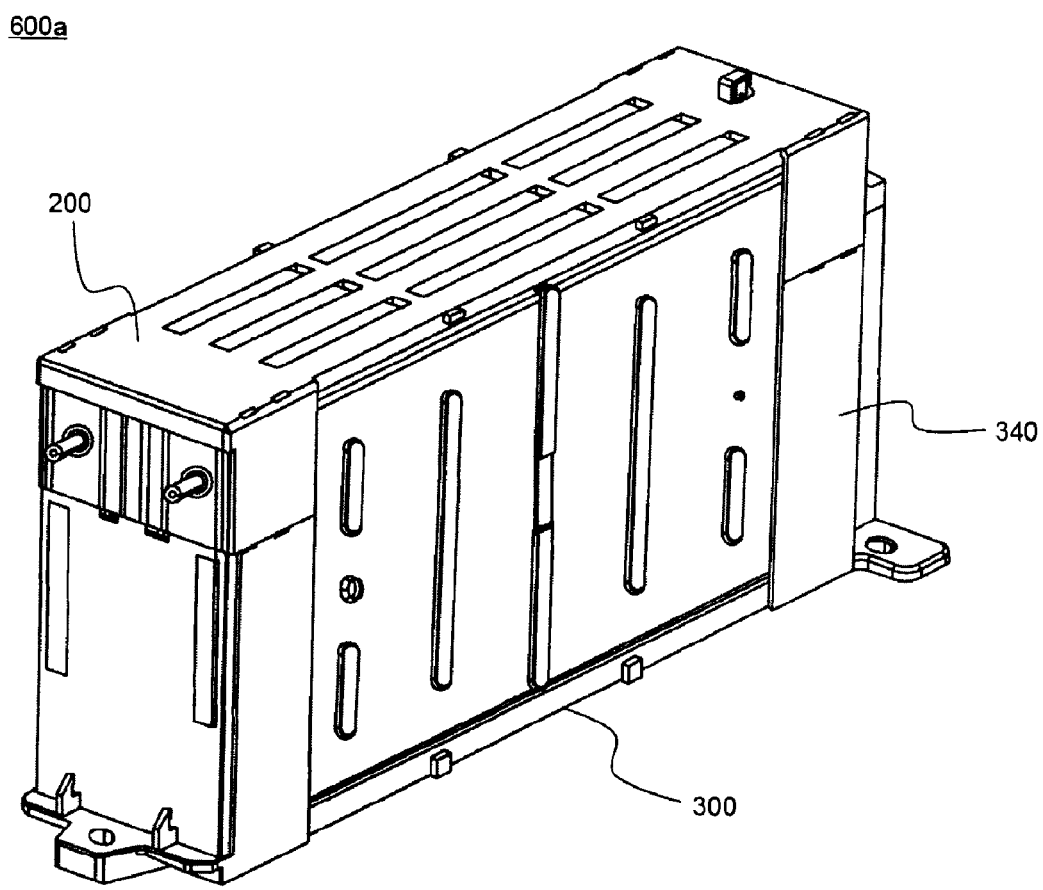
Figure 10:
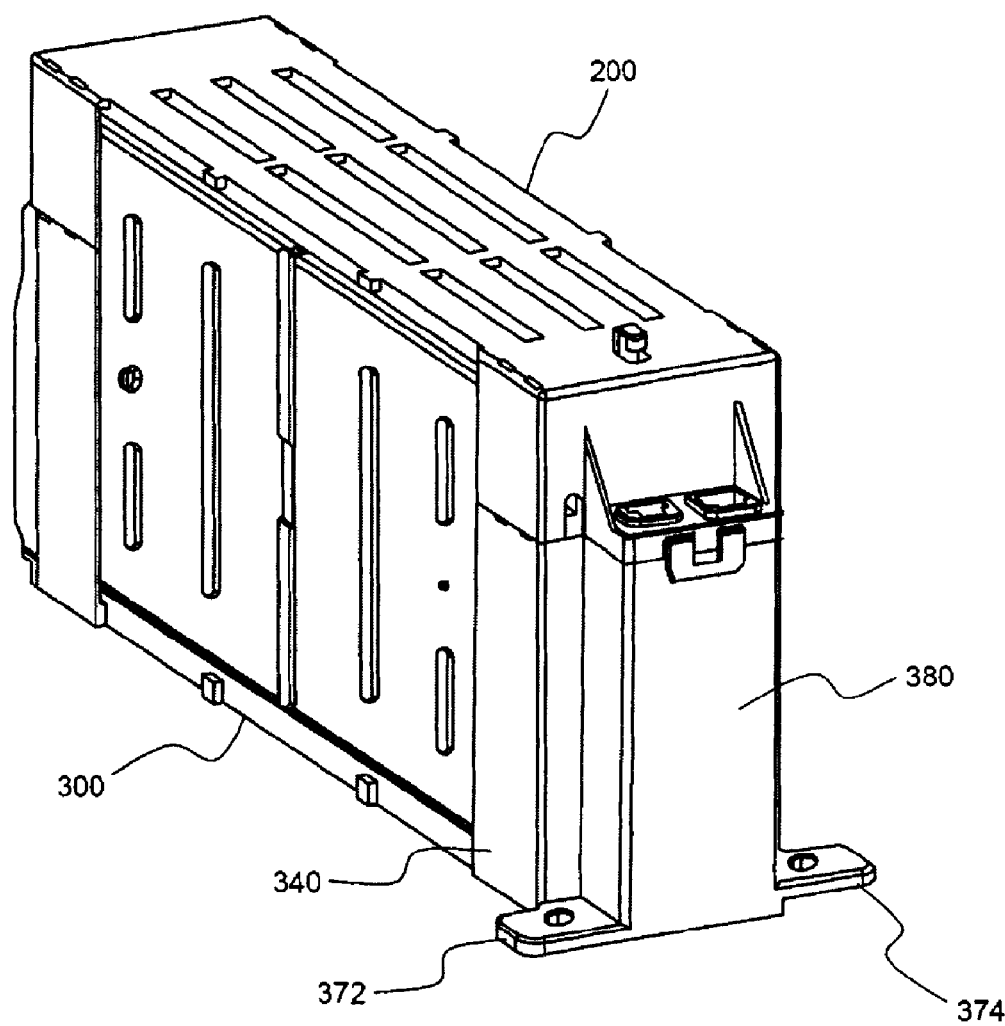

FIGS. 8 to 10 are perspective views illustrating a middle- or large-sized battery pack according to an embodiment of the present invention.

Referring to FIG. 8 together with FIG. 5, the conductive sensing parts 531 are connected to the BMS 400 via the wire type connection part 520 mounted to the lower end of the lower case 300. The lower case 300 is provided at the bottom 390 thereof with a depression 392 in which the connection part 520 is inserted. At the inside of the depression 392 are formed a plurality of protrusions 394 which are alternately oriented to stably fix the connection part 520 inserted in the depression 392.

Referring to FIGS. 9 and 10, battery modules 600a and 600b are easily assembled by the coupling between the upper and lower cases 200 and 300. The BMS (not shown) is received in the BMS receiving part 380 integrally formed at the rear end of the rear part 340 of the lower case 300. Consequently, the battery modules 600a and 600b are configured in a simple and compact structure. Also, the connection between the battery modules 600a and 600b may be achieved by coupling between a pair of coupling parts 372 and 374 formed at the lower end of the rear part 340 of the lower case 300 such that the pair of coupling parts 372 and 374 have different heights.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A voltage sensing member for sensing voltages of battery cells constituting a battery module, the voltage sensing member including
   (a) a pair of supporting parts including a front supporting part and a rear supporting part, mounted to a bottom of the battery module at regions at a front part and a rear part of the battery module corresponding to electrode terminal connections of the battery cells,
   (b) a connection part for electrically interconnecting the front supporting part and the rear supporting part,
   (c) plate strip shaped conductive sensing parts having one-side ends coupled to the corresponding supporting parts via wires, each of the plate strip shaped conductive sensing parts having a larger contact surface than each of the wires, each of the plate strip shaped conductive sensing parts having a smaller size than the electrode terminal connections, and
   (d) a connector mounted on the front supporting part or the rear supporting part for transmitting the sensed voltages of the battery cells to a battery control device, wherein
   the conductive sensing parts are directly connected to the electrode terminal connections of the battery cells in a surface contact manner, and
   a portion of each of the electrode terminal connections is cut to a size corresponding to the size of each of the plate strip shaped conductive sensing parts.

2. The voltage sensing member according to claim 1, wherein each of the plate strip shaped conductive sensing parts has a width equivalent to 10 to 80% of a width of each of the electrode terminal connections.

3. The voltage sensing member according to claim 1, wherein each of the plate strip shaped conductive sensing parts has a height equivalent to 20 to 70% of a height of each of the electrode terminal connections.

4. The voltage sensing member according to claim 1, wherein each of the plate strip shaped conductive sensing parts has a surface contact area with respect to a corresponding one of the electrode terminal connections equivalent to 30 to 60% of a connection area of each of the electrode terminal connections.

5. The voltage sensing member according to claim 1, wherein, at each of the electrode terminal connections, one-side electrode terminal (a) is cut to a size corresponding to a size of each of the plate strip shaped conductive sensing parts, and one-side electrode terminal (a) and a corresponding one of the plate strip shaped conductive sensing parts are connected to the other-side electrode terminal (b) in a surface contact manner.

6. The voltage sensing member according to claim 1, wherein connection between the electrode terminal connections and the plate strip shaped conductive sensing parts is achieved by welding.

7. The voltage sensing member according to claim 1, wherein the front supporting part and the rear supporting part are formed of a printed circuit board (PCB).

8. The voltage sensing member according to claim 1, wherein the plate strip shaped conductive sensing parts are formed of a copper strip.

9. The voltage sensing member according to claim 1, wherein the electrode terminal connections are bent perpendicularly in a direction in which ends of anode terminals of the battery cells facing cathode terminals of the battery cells face each other.

10. The voltage sensing member according to claim 9, wherein the cathode terminals are copper electrode leads, and the anode terminals are aluminum electrode leads.

11. The voltage sensing member according to claim 10, wherein, at each of the electrode terminal connections, an end of each of the copper electrode leads is cut to a size corresponding to a size of each of the plate strip shaped conductive sensing parts, and each of the copper electrode leads and a corresponding one of the plate strip shaped conductive sensing parts are coupled to each of the aluminum electrode leads by welding.

12. The voltage sensing member according to claim 1, wherein an insulative protection film is provided at a connection region between each of the plate strip shaped conductive sensing parts and a corresponding one of the electrode terminal connections.

13. A battery module including the voltage sensing member according to claim 1.

14. The battery module according to claim 13, wherein the battery module includes
  (a) a battery cell stack including a plurality of battery cells or unit modules connected in series to each other in a state in which the battery cells or the unit modules stand in a lateral direction thereof,
  (b) an upper case configured in a structure to surround one side of the battery cell stack and to surround a portion of an upper end and a portion of a lower end of the battery cell stack, the upper case being provided at a front part thereof with external input and output terminals,
  (c) a lower case coupled to the upper case for surrounding the other side of the battery cell stack and surrounding a portion of the upper end and a portion of the lower end of the battery cell stack, the lower case being provided at a front part thereof with bus bars for connecting electrode terminals of the battery cells to the external input and output terminals, the voltage sensing member being mounted at a bottom of the lower case, and
  (d) a front cover mounted to the front part of the lower case for protecting connection regions between the electrode terminals of the battery cells and the bus bars from outside, the front cover being made of an insulative material.

15. The battery module according to claim 14, wherein the voltage sensing member includes the plate strip shaped conductive sensing parts mounted in spaces defined on the front and rear parts of the lower case such that the plate strip shaped conductive sensing parts are coupled to the electrode terminal connections, the supporting parts, and the connection part, the supporting parts and the connection part being mounted to the bottom of the lower case.

16. The battery module according to claim 14, wherein the battery cell stack includes a plurality of unit modules each including plate-shaped battery cells having electrode terminals formed at upper and lower ends thereof, and
  each unit module includes two or more battery cells configured in a stacked structure in which electrode terminals of the battery cells are connected in series to each other and electrode terminal connections are bent such that the battery cells are stacked and a pair of high-strength cell covers configured to surround outsides of the battery cells excluding the electrode terminals of the battery cells when the cell covers are coupled with each other.

17. The battery module according to claim 14, wherein the lower case is provided at the front part and a rear part thereof with spaces in which supporting parts and plate strip shaped conductive sensing parts of the voltage sensing member are placed, and the plate strip shaped conductive sensing parts are connected to portions of series-connection bent regions providing electrode terminal connections of the electrode terminals of the battery cells in a surface contact manner by welding.

18. The battery module according to claim 14, wherein the lower case is provided at the front part thereof with a pair of slits through which outermost electrode terminals of the battery cell stack are inserted, and the outermost electrode terminals of the battery cell stack are inserted through the slits and then connected to the bus bars located at the front part of the lower case.

19. The battery module according to claim 14, wherein the lower case is provided at the rear part thereof with a battery control device connected to the voltage sensing member for monitoring and controlling an operation of the battery module.

20. A battery system manufactured using the battery module according to claim 13 as a unit body.

21. The battery system according to claim 20, wherein the battery system is used as a power source for electric vehicles, hybrid electric vehicles, or plug-in hybrid electric vehicles.

22. The voltage sensing meter according to claim 1, wherein the plate strip shaped conductive sensing parts do not include springs.

* * * * *